(12) United States Patent
Clark et al.

(10) Patent No.: US 7,790,628 B2
(45) Date of Patent: Sep. 7, 2010

(54) METHOD OF FORMING HIGH DIELECTRIC CONSTANT FILMS USING A PLURALITY OF OXIDATION SOURCES

(75) Inventors: Robert D Clark, Schenectady, NY (US); Lisa F Edge, Watervliet, NY (US)

(73) Assignee: Tokyo Electron Limited, Tokyo (JP)

( * ) Notice: Subject to any disclaimer, the term of this patent is extended or adjusted under 35 U.S.C. 154(b) by 334 days.

(21) Appl. No.: 11/839,699

(22) Filed: Aug. 16, 2007

(65) Prior Publication Data
US 2009/0047798 A1    Feb. 19, 2009

(51) Int. Cl.
*H01L 21/31*    (2006.01)
*H01L 21/469*    (2006.01)

(52) U.S. Cl. .................. 438/778; 257/E21.17; 438/788; 438/792

(58) Field of Classification Search .................. 438/778, 438/788, 792; 257/E21.17
See application file for complete search history.

(56) References Cited

U.S. PATENT DOCUMENTS

| | | | |
|---|---|---|---|
| 6,858,546 B2 | 2/2005 | Niinisto et al. | |
| 6,858,547 B2 | 2/2005 | Metzner et al. | |
| 6,884,685 B2 | 4/2005 | Luo et al. | |
| 6,884,719 B2 * | 4/2005 | Chang et al. | 438/681 |
| 7,205,247 B2 | 4/2007 | Lee et al. | |
| 7,304,004 B2 | 12/2007 | Metzner et al. | |
| 7,365,027 B2 * | 4/2008 | Ahn et al. | 438/783 |
| 2003/0031793 A1 | 2/2003 | Chang et al. | |
| 2003/0194853 A1 | 10/2003 | Jeon | |
| 2004/0198069 A1 | 10/2004 | Metzner et al. | |
| 2005/0056219 A1 | 3/2005 | Dip et al. | |
| 2005/0233156 A1 | 10/2005 | Sensaki et al. | |
| 2006/0068603 A1 | 3/2006 | Wajda | |
| 2006/0133955 A1 | 6/2006 | Peters | |

(Continued)

FOREIGN PATENT DOCUMENTS

EP    20021205574 A2    5/2002

(Continued)

OTHER PUBLICATIONS

Clark, U.S. Appl. No. 11/688,675, "Method of Forming Crystallographically Stabilized Doped Hafnium Zirconium Based Films", filed Mar. 20, 2007.

(Continued)

*Primary Examiner*—Asok K Sarkar (57) ABSTRACT

A method is provided for depositing a high dielectric constant (high-k) film for integrated circuits (ICs) by atomic layer deposition (ALD) or chemical vapor deposition (CVD). The method includes exposing a substrate to one or more metal precursors and plurality of oxidation sources to deposit a high-k film with a desired thickness and tailored properties. The plurality of oxidation sources contain a first oxidation source containing $H_2O$, $H_2O_2$, or a combination thereof, and a second oxidation source containing oxygen radicals (O), $O_3$, or $O_2$, or a combination of two or more thereof. The high-k film may contain one or more metal elements selected from alkaline earth elements, rare earth elements, and Group IVB elements of the Periodic Table of the Elements.

17 Claims, 7 Drawing Sheets

U.S. PATENT DOCUMENTS

| | | |
|---|---|---|
| 2006/0156979 A1 | 7/2006 | Thakur et al. |
| 2007/0037412 A1 | 2/2007 | Dip et al. |
| 2007/0237697 A1 | 10/2007 | Clark |
| 2007/0252244 A1* | 11/2007 | Srividya et al. ............. 257/635 |

FOREIGN PATENT DOCUMENTS

| | | |
|---|---|---|
| WO | 2003035926 A2 | 5/2003 |
| WO | 2005050715 A2 | 4/2005 |
| WO | 2005113855 A1 | 12/2005 |

OTHER PUBLICATIONS

Myllymaki et al., High-Permittivity YScO3 thin films by atomic layer deposition using two precursor approaches, Journal of Materials Chemistry, 2006, 16, pp. 563-569.

Kawahara et al., Effects of Hf Sources, Oxidizing Agents, and NH3 Radicals on Properties of HfAlOx films Prepared by Atomic Layer Deposition, IWGI, 2003, pp. 32-37, Piscataway, NJ.

* cited by examiner

METHOD OF FORMING HIGH DIELECTRIC CONSTANT FILMS USING A PLURALITY OF OXIDATION SOURCES

FIELD OF INVENTION

The present invention relates generally to the field of forming high dielectric constant (high-k) materials for semiconductor manufacturing, and more particularly to methods of forming high-k films by atomic layer deposition (ALD) or chemical vapor deposition (CVD).

BACKGROUND OF THE INVENTION

In microelectronics, continuous shrinking of devices is necessary to improve the performance, which sets challenging requirements for fabrication of integrated circuits (ICs). New materials and manufacturing techniques are required and materials must be grown in the form of very thin blanket films and thin films covering deep trenches and other three dimensional (3D) structures with good conformality. Atomic layer deposition (ALD) has gathered interest in the microelectronic industry from the unique characteristics that the method offers: ultra-thin films can be deposited on large substrates with excellent conformality and with control of thickness and composition at the nanometer level. ALD has high potential for use in microelectronics for high-k film growth for complementary metal oxide semiconductor (CMOS) devices and dynamic random access memory (DRAM) capacitors as well as for ferroelectrics, barrier materials, and conductors such as metal gates.

High-k dielectrics have been extensively studied due to the fact that $SiO_2$, which is traditionally used as a gate oxide in metal-oxide semiconductor field effect transistors (MOSFETs), can no longer function as an effective gate insulator as higher capacitance density with decreased gate oxide thickness is required for near-future device generations. Silicon oxynitride, $SiO_xN_y$, has been used to extend the use of silicon oxide-based gate dielectrics but a long term alternative solution is required. Many high-k dielectric materials under evaluation suffer from various problems, including film crystallization during anneals, growth of interfacial layers during deposition and further processing, large densities of interface traps, reduced channel mobility, reaction with poly-silicon gates, and Fermi level pinning with metal gates. Other problems encountered with many high-k dielectric materials include dielectric constants that are too low compared to desired values for advanced semiconductor devices. The dielectric constant of a film stack may be further reduced by the presence of an interfacial layer between the high-k dielectric material and the underlying substrate. Accordingly, further developments for forming high-k dielectric materials are needed to solve these and other problems of prior art high-k dielectric materials.

SUMMARY OF THE INVENTION

Embodiments of the invention provide a method for depositing high-k films for integrated circuits (ICs) by ALD or CVD. The method includes exposing a substrate to one or more metal precursors and a plurality of oxidation sources to deposit a high-k film with a desired thickness and tailored chemical and electrical properties. The plurality of oxidation sources contain a first oxidation source containing water ($H_2O$), peroxide (e.g., hydrogen peroxide ($H_2O_2$)), or a combination thereof, and a second oxidation source containing oxygen radicals (O), ozone ($O_3$), oxygen ($O_2$), or a combination of two or more thereof. The high-k film may contain one or more metal elements selected from alkaline earth elements, rare earth elements, and Group IVB elements of the Periodic Table of the Elements.

According to one embodiment of the invention, the method includes disposing a substrate in a process chamber, and exposing the substrate to a gas pulse sequence to deposit a high-k film with a predetermined thickness. The gas pulse sequence includes, in any order: a) sequentially first, exposing the substrate to a gas pulse containing a first metal precursor, and second, exposing the substrate to a gas pulse containing $H_2O$, $H_2O_2$, or a combination thereof, and b) sequentially first, exposing the substrate to a gas pulse containing a second metal precursor, and second, exposing the substrate to a gas pulse containing oxygen radicals (O), $O_3$, or $O_2$, or a combination of two or more thereof, where each of a) and b) are repeated any number of desired times, and where the gas pulse sequence including a) and b) is repeated, in any order, any number of desired times to achieve the predetermined thickness.

According to another embodiment of the invention, the gas pulse sequence includes: sequentially first, exposing the substrate to a gas pulse containing a metal precursor, and second, exposing the substrate to a gas pulse containing a first oxidation source and a second oxidation source, where the first oxidation source contains $H_2O$, $H_2O_2$, or a combination thereof, and the second oxidation source contains oxygen radicals (O), $O_3$, or $O_2$, or a combination of two or more thereof, where the gas pulse sequence is repeated any number of times to achieve the predetermined thickness.

According to yet another embodiment of the invention, the method includes disposing a substrate in a process chamber, and exposing the substrate to a metal precursor, a first oxidation source, and a second oxidation source, where the first oxidation source contains $H_2O$, $H_2O_2$, or a combination thereof, the second oxidation source contains oxygen radicals (O), $O_3$, or $O_2$, or a combination of two or more thereof, and a ratio of the first and second oxidation sources is varied during at least a portion of the exposing.

DETAILED DESCRIPTION OF SEVERAL EMBODIMENTS

Methods for depositing high-k films using ALD and CVD are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

There is a general need for new methods that provide flexibility for depositing high-k films with tailored material and electrical properties for advanced semiconductor devices. ALD can be used to deposit a wide variety of high-k materials such as oxides, silicates, and oxynitrides for fabrication of advanced ICs. A high-k material deposited by ALD can be used as a gate dielectric film in MOSFETs and capacitors of DRAM devices, for example deep trench DRAM structures or stacked DRAM structures. In a deep trench DRAM structure, a capacitor may be built into a high aspect ratio (depth/width) trench etched into a semiconductor substrate. The aspect ratio of the deep trench can, for example, be between about 25 and about 60, which can benefit from highly conformal deposition provided by ALD.

ALD is a variant of CVD, but unlike CVD, ALD relies on sequential and saturating surface reactions of alternately applied precursor pulses. Film growth proceeds in a cyclic manner, thereby enabling easy film thickness control. When depositing a high-k oxide film (e.g., $HfO_2$), one ALD cycle can include exposing a substrate surface to a gaseous metal precursor (e.g., $Hf(NEtMe)_4$) to saturate the surface with chemisorbed metal precursor on the available surface sites (e.g., —OH groups). After inert gas purging of the excess metal precursor and surface reaction byproducts, the surface is exposed to an oxidation source (e.g., $H_2O$) to form the desired metal oxide film and after inert gas purging the surface is ready for the next ALD cycle.

ALD is a chemical deposition method where the precursor chemistry has a decisive effect on the quality and properties of the deposited films. The metal precursor should be sufficiently volatile and not undergo significant self-decomposition at deposition temperature. The metal precursor must adsorb or react with the surface sites and, during deposition of an oxide high-k film, it's reactivity must be sufficient towards the oxidation source. Therefore, another factor in the precursor chemistry of oxide film growth is the selection of the oxidation source, which can strongly affect the resulting film properties. In one example, a weak oxidation source can be replaced, if needed, by a stronger oxidation source to obtain the desired film properties.

Many oxidation sources are available for ALD of metal oxide films. $H_2O$ is the most commonly used oxidation source for ALD but other oxidation sources include oxygen radicals (O), $O_3$, $O_2$, and a peroxide such as $H_2O_2$. Embodiments of the inventions are not limited to $H_2O_2$, as other peroxides may be used. In general, peroxides have the formula $R_1OOR_2$, where $R_1$ and $R_2$ can be H or organic groups. The reaction (oxidation) strength of an oxidation source towards one or more metal precursors and a substrate (e.g., a Si substrate) needs to be considered in view of the desired properties of a high-k film to be deposited, the overall dielectric constant of the high-k film and any interface layers, and any materials on the high-k film. The oxidation strength of some of the commonly used oxidation sources has the following trend: $O>O_3>H_2O_2>H_2O$. A strong oxidation source, such as $O_3$, can cause the formation of a fairly thick low permittivity interfacial layer (e.g., $SiO_x$) on a hydrogen(H)-terminated Si substrate. This can require careful usage of $O_3$ in ALD processing to minimize formation of an interface layer during deposition and this may affect the acceptance of $O_3$ as a long-term solution for gate dielectric fabrication. However, the usage of $O_3$ can produce denser high-k films with lower impurity levels and enhanced electrical properties when compared to $H_2O$.

According to embodiments of the invention, different reaction mechanisms may be enabled by the different oxidation sources. As described above, $H_2O$ is a weaker oxidation source than $O_3$ in ALD processing and the use of $H_2O$ relies on the presence of hydroxyl (—OH) groups on the starting growth surface of the substrate. Furthermore, the usage of $H_2O$ requires high reactivity of the chemisorbed metal precursor towards $H_2O$, otherwise the initial nucleation of the high-k film on the surface of the substrate may be inhibited, resulting in island-like high-k film growth mechanism, and formation of a low density high-k film with poor electrical properties. Even though $H_2O$ is a weaker oxidation source than $O_3$, the acid/base reactions (i.e., protonolysis) of $H_2O$ can be very effective in removing carbon impurities from a high-k film, in particular for highly basic metal precursor ligands.

One potential advantage of using $H_2O$ over $O_3$ in ALD is that $H_2O$ is a mild oxidation source and therefore less likely to contribute significantly to growth of a low permittivity interface layer between the substrate and the high-k film during deposition. However, $H_2O$ forms strong hydrogen bonds that can require long purge times and/or pumping times during an ALD cycle, thereby resulting in long ALD cycle times and low manufacturing throughput. Furthermore, the use of $H_2O$ (and $H_2O_2$) can contribute to trapped $H_2O$ species or hydroxyls in the deposited high-k film which can result in reduced electron mobility in the high-k films and deleterious electrical effects in a semiconductor device. The trapped $H_2O$ species or hydroxyls can also contribute to oxidation of other materials over or under the high-k film during post-deposition annealing steps, for example oxidation of an underlying substrate or oxidation of a gate electrode on the high-k film. For comparison, the use of $O_3$ allows for decreased ALD cycle times and it is less likely to leave trapped oxidation species in the deposited high-k film.

Embodiments of the invention provide ALD and CVD methods for forming high-k films using one or more metal precursors and a plurality of oxidation sources. The one or more metal precursors can contain one or more metal elements selected from alkaline earth elements, rare earth elements, and Group IVB elements of the Periodic Table of the Elements. Embodiments of the invention utilize a first oxidation source containing a molecule having both hydrogen and oxygen, i.e., $H_2O$, $H_2O_2$, or a combination thereof, and a second oxidation source containing a molecule having oxygen but not hydrogen, i.e., oxygen radicals (O), $O_3$, or $O_2$, or a combination of two or more thereof. The first and second oxidation sources may be used separately or in combination during deposition of the high-k film. The plurality of oxidation sources provide flexibility for tailoring the properties of a high-k film, including the amount and distribution of trapped $H_2O$ species and hydroxyls through a thickness of the film, growth of interface layers in contact with the high-k film, film deposition rate, and manufacturing throughput.

According to one embodiment of the invention, a multipart high-k film may contain a plurality of high-k films with different thicknesses and properties. In one example, the multipart high-k film may contain a first high-k film deposited on a substrate and a second high-k film deposited on the first high-k film. The first high-k film can, for example, have a thickness of about 5-15 angstrom ($10^{-10}$ m) and may be deposited by ALD using a first oxidation source containing $H_2O$, $H_2O_2$, or a combination thereof. The second high-k film can have a thickness of about 5-15 angstrom and may be deposited by ALD using a second oxidation source containing oxygen radicals (O), $O_3$, $O_2$, or a combination thereof. The presence of the first high-k film on the substrate prevents or reduces exposure of the substrate material (e.g., Si) to the second oxidation source, thereby reducing oxidation of the substrate material during deposition of the second high-k film on the first high-k film. Furthermore, the use of the second oxidation source to deposit the second high-k film on the first high-k film reduces the amount of trapped $H_2O$ or $H_2O_2$ species and hydroxyls in the upper region of the high-k film, reduces the ALD cycle time, and increases throughput, compared to if $H_2O$ or $H_2O_2$ is used to deposit the entire high-film. According to another embodiment of the invention, the order of the first and second high-k films may be reversed.

According to yet another embodiment of the invention, a multipart high-k film may contain a first high-k film on the substrate, a second high-k film on the first high-k film, and a third high-k film on the second high-k film. In one example, the first high-k film may be deposited on the substrate by ALD using a first oxidation source containing oxygen radicals (O), $O_3$, $O_2$, or a combination of two or more thereof, a second high-k film deposited on the first high-k film by ALD using a second oxidation source containing $H_2O$, $H_2O_2$, or a combination thereof, and a third high-k film deposited on the second high-k film by ALD using the first oxidation source containing oxygen radicals (O), $O_3$, $O_2$, or a combination of two or more thereof. The resulting high-k film may have reduced interface growth and reduced impurities such as carbon in the second high-k film. In another example, the first and third high-k films may be deposited by ALD using the second oxidation source, and the second high-k film may be deposited using the first oxidation source.

According to still another embodiment of the invention, a high-k film may be deposited on the substrate by CVD by exposing the substrate to a metal precursor, a first oxidation source, and a second oxidation source, where the first oxidation source comprises $H_2O$, $H_2O_2$, or a combination thereof, and the second oxidation source comprises oxygen radicals (O), $O_3$, or $O_2$, or a combination of two or more thereof, where a ratio of the first and second oxidation sources is varied during at least a portion of the exposing.

In the following description, in order to facilitate a thorough understanding of embodiments of the invention and for purposes of explanation and not limitation, specific details are set forth, such as a particular geometry of a processing system and descriptions of various components. However, it should be understood that the invention may be practiced in other embodiments that depart from these specific details.

Figure 1:
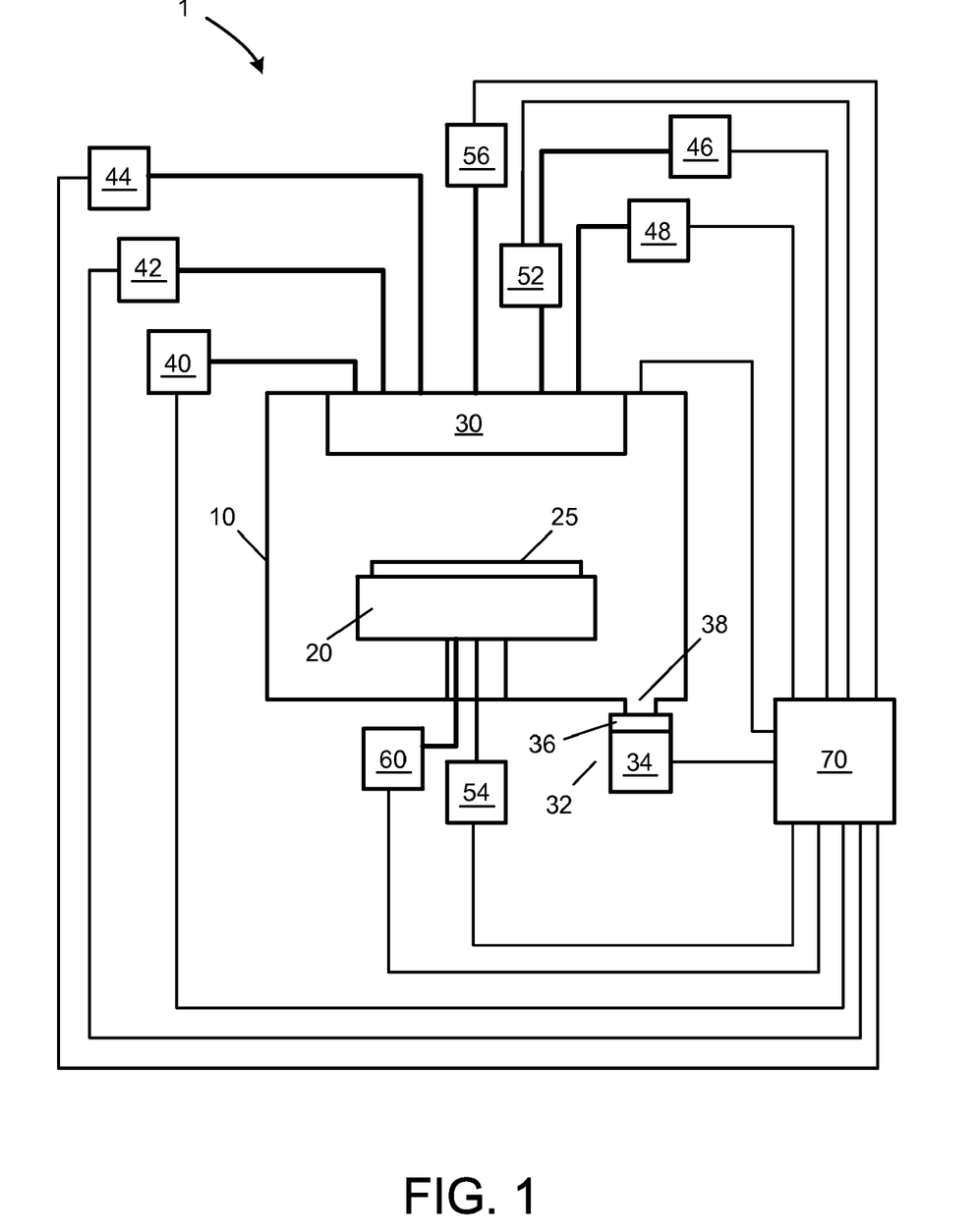
FIG. 1 depicts a schematic view of a processing system according to an embodiment of the invention.

Referring now to the drawings, FIG. 1 illustrates a processing system 1 for depositing high-k films on a substrate according to embodiments of the invention. The processing system 1 is configured for performing ALD processing or CVD processing or both, and includes a process chamber 10 having a substrate holder 20 configured to support a substrate 25, upon which the high-k film is formed. The process chamber 10 further contains an assembly 30 (e.g., a showerhead) coupled to a first metal precursor supply system 40, a second metal precursor supply system 42, a first oxidation source supply system 44, a second oxidation source supply system 46, and a purge gas supply system 48. Although not shown in FIG. 1, the processing system may contain further gas supply systems for introducing additional gases (e.g., silicon precursors) to the process chamber. The processing system 1 may be configured to process 200 mm substrates, 300 mm substrates, or larger-sized substrates. In fact, it is contemplated that the processing system 1 may be configured to process substrates, wafers, or flat panels regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the high-k films described in the embodiments of the invention.

The purge gas supply system 48 is configured to introduce a purge gas to the process chamber 10. For example, the introduction of the purge gas may occur between introduction of pulses of metal precursors and oxidation sources to the process chamber 10. The purge gas can comprise an inert gas, such as a noble gas (i.e., He, Ne, Ar, Kr, or Xe), nitrogen ($N_2$), or hydrogen ($H_2$).

The first oxidation source supply system 44 may be configured to flow $H_2O$, $H_2O_2$, or a combination thereof, into the process chamber 10 through the assembly 30.

The processing system 1 includes a plasma generation system configured to generate a plasma during at least a portion of the gas exposures in the process chamber 10. The second oxidation source supply system 46 may be configured to flow $O_2$ gas to remote plasma system 52 where the $O_2$ gas is plasma excited to form an $O_3+O_2$ mixture. An exemplary $O_3+O_2$ mixture contains about 5% $O_3$, balance $O_2$. The remote plasma system 52 can, for example, contain a microwave frequency generator. The $O_3+O_2$ mixture, hereafter referred to as $O_3$, is then introduced into the process chamber 10 through the assembly 30 and exposed to the substrate 25. Oxygen radicals (O) may be produced from $O_2$ gas in the process chamber 10 using a first power source 56 coupled to the process chamber 10, and configured to couple power to gases introduced into the process chamber 10 through the assembly 30. The first power source 56 may be a variable power source and may include a radio frequency (RF) generator and an impedance match network, and may further include an electrode through which RF power is coupled to the plasma in process chamber 10. The electrode can be formed in the assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 56 may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source. Alternatively, the first power source 56 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716.

As those skilled in the art will readily recognize, the first oxidation source supply system 44 and the second oxidation source supply system 46 can be further configured to flow an inert gas, such as a noble gas, $N_2$, or $H_2$, into the process chamber.

The processing system 1 further includes a substrate bias generation system configured to optionally generate or assist in generating a plasma (through substrate holder biasing) during at least a portion of the alternating introduction of the gases to the process chamber 10. The substrate bias system can include a substrate power source 54 coupled to the substrate holder 20, and configured to couple power to the substrate 25. The substrate power source 54 may include a RF generator and an impedance match network, and may further include an electrode through which RF power is coupled to substrate 25. The electrode can be formed in substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 1 as separate entities, they may indeed comprise one or more power sources coupled to substrate holder 20.

Furthermore, processing system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the temperature of the substrate from room temperature to approximately 150° C. to 550° C. Alternatively, the temperature of the substrate can, for example, range from approximately 150° C. to 350° C. It is to be understood, however, that the temperature of the substrate is selected based on the desired temperature for causing deposition of a particular high-k film on the surface of a given substrate.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the high-k film on the substrate 25. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure measuring device can be, for example, an absolute capacitance manometer. The pressure control system 32 can, for example, be configured to control the process chamber pressure between about 0.1 Torr and about 100 Torr during deposition of the high-k film.

The first and second metal precursor supply systems 40 and 42, the purge gas supply system 48, and the first and second oxidation source supply systems 44 and 46, can include one or more pressure control devices, one or more flow control devices, one or more filters, one or more valves, and/or one or more flow sensors. The flow control devices can include pneumatic driven valves, electromechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 0.3 sec and about 10 sec. Exemplary gas pulse lengths for metal precursors can be between 0.3 and 3 sec, for example 1 sec. Exemplary gas pulse lengths for an oxidation source can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Furthermore, the processing system 1 includes a controller 70 that can be coupled to the process chamber 10, substrate holder 20, assembly 30 configured for introducing process gases into the process chamber 10, vacuum pumping system 34, first metal precursor supply system 40, second metal precursor supply system 42, purge gas supply system 48, first oxidation source supply system 44, second oxidation source supply system 46, remote plasma system 52, substrate power source 54, first power source 56, and substrate temperature control system 60. Alternatively, or in addition, controller 70 can be coupled to one or more additional controllers/computers (not shown), and controller 70 can obtain setup and/or configuration information from an additional controller/computer.

The controller 70 can comprise a microprocessor, memory, and a digital I/O port capable of generating control voltages sufficient to communicate and activate inputs to the processing system 1 as well as monitor outputs from the processing system 1. For example, a program stored in the memory may be utilized to activate the inputs to the aforementioned components of the processing system 1 according to a process recipe in order to perform a deposition process. One example of the controller 70 is a DELL PRECISION WORKSTATION 610TM, available from Dell Corporation, Austin, Tex. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 70 for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

The first metal precursor supply system 40 and the second metal precursor supply system 42 are configured to alternately or simultaneously introduce metal precursors containing one or more metal elements selected from alkaline earth elements, rare earth elements, and Group IVB elements of the Periodic Table of the Elements. The alternation of the introduction of the metal precursors can be cyclical, or it may be acyclical with variable time periods between introduction of the one or more metal precursors. As those skilled in the art will readily recognize, the first metal precursor supply system 40 and the second metal precursor supply system 42 can be configured to flow an inert gas, such as a noble gas, $N_2$, or $H_2$, into the process chamber 10.

Several methods may be utilized for introducing the metal precursors to the process chamber 10. One method includes vaporizing precursors through the use of separate bubblers or direct liquid injection systems, or a combination thereof, and then mixing in the gas phase within or prior to introduction into the process chamber 10. By controlling the vaporization rate of each metal precursor separately, a desired metal element stoichiometry can be attained within the high-k film. Another method of delivering each metal precursor includes separately controlling two or more different liquid sources, which are then mixed prior to entering a common vaporizer. This method may be utilized when the metal precursors are compatible in solution or in liquid form and they have similar vaporization characteristics. Other methods include the use of compatible mixed solid or liquid precursors within a bubbler. Liquid source precursors may include neat liquid metal precursors, or solid or liquid metal precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the various precursors within a gas pulse, it is possible to deposit mixed high-k films with desired stoichiometries.

Embodiments of the inventions may utilize a wide variety of different alkaline earth precursors. For example, many alkaline earth precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyrroles, pyrrolidines, amines, crown ethers, glymes, and nitriles.

Examples of L group alkoxides include tert-butoxide, iso-propoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide, di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl. Examples of alkyls include bis (trimethylsilyl)methyl, tris(trimethylsilyl)methyl, and trimethylsilylmethyl. Examples of amidinates include N,N'-di-tert-butylacetamidinate, N,N'-di -iso-propylacetamidinate, N,N'-di-isopropyl-2-tert-butylamidinate, and N,N'-di-tert-butyl-2-tert -butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6, 10-Crown-4, pyridine, N -methylpyrrolidine, triethylamine, trimethylamine, acetonitrile, and 2,2-dimethylpropionitrile.

Representative examples of alkaline earth precursors include:

Be precursors: $Be(N(SiMe_3)_2)_2$, $Be(TMPD)_2$, and $BeEt_2$.

Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(iPr_4Cp)_2$, and $Ca(Me_5Cp)_2$.

Sr precursors: Bis(tert-butylacetamidinato)strontium (TBAASr), $Sr(N(SiMe_3)_2)_2$, $Sr(THD)_2$, $Sr(THD)_2$(tetraglyme), $Sr(iPr_4Cp)_2$, $Sr(iPr_3Cp)_2$, and $Sr(Me_5Cp)_2$.

Ba precursors: Bis(tert-butylacetamidinato)barium (TBAABa), $Ba(N(SiMe_3)_2)_2$, $Ba(THD)_2$, $Ba(THD)_2$(tetraglyme), $Ba(iPr_4Cp)_2$, $Ba(Me_5Cp)_2$, and $Ba(nPrMe_4Cp)_2$.

Representative examples of Group IVB precursors include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $Ti(mmp)_4$, $HfCl_4$, $ZrCl_4$, $TiCl_4$, $Ti(NiPr_2)_4$, $Ti(NiPr_2)_3$, tris (N,N'-dimethylacetamidinato)titanium, $ZrCp_2Me_2$, $Zr(tBuCp)_2Me_2$, $Zr(NiPr_2)_4$, $Ti(OiPr)_4$, $Ti(O^tBu)_4$ (titanium tert-butoxide, TTB), $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), and $Ti(THD)_3$ (tris(2,2,6,6-tetramethyl-3,5-heptanedionato)titanium).

Embodiments of the inventions may utilize a wide variety of different rare earth precursors. For example, many rare earth precursors have the formula:

$$ML^1L^2L^3D_x$$

where M is a rare earth metal element selected from the group of scandium (Sc), yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyrroles, pyrrolidines, amines, crown ethers, glymes, and nitriles.

Examples of L groups and D ligands are identical to those presented above for the alkaline earth precursor formula.

Representative examples of rare earth precursors include:

Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3.CH_3(OCH_2CH_2)_3OCH_3$, $La(C_{11}H_{19}O_2)_3.CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3.CH_3(OCH_2CH_2)_3OCH_3$, $Ce(C_{11}H_{19}O_2)_3.CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3 CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3$™, $Cp_3$™, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Figure 2:
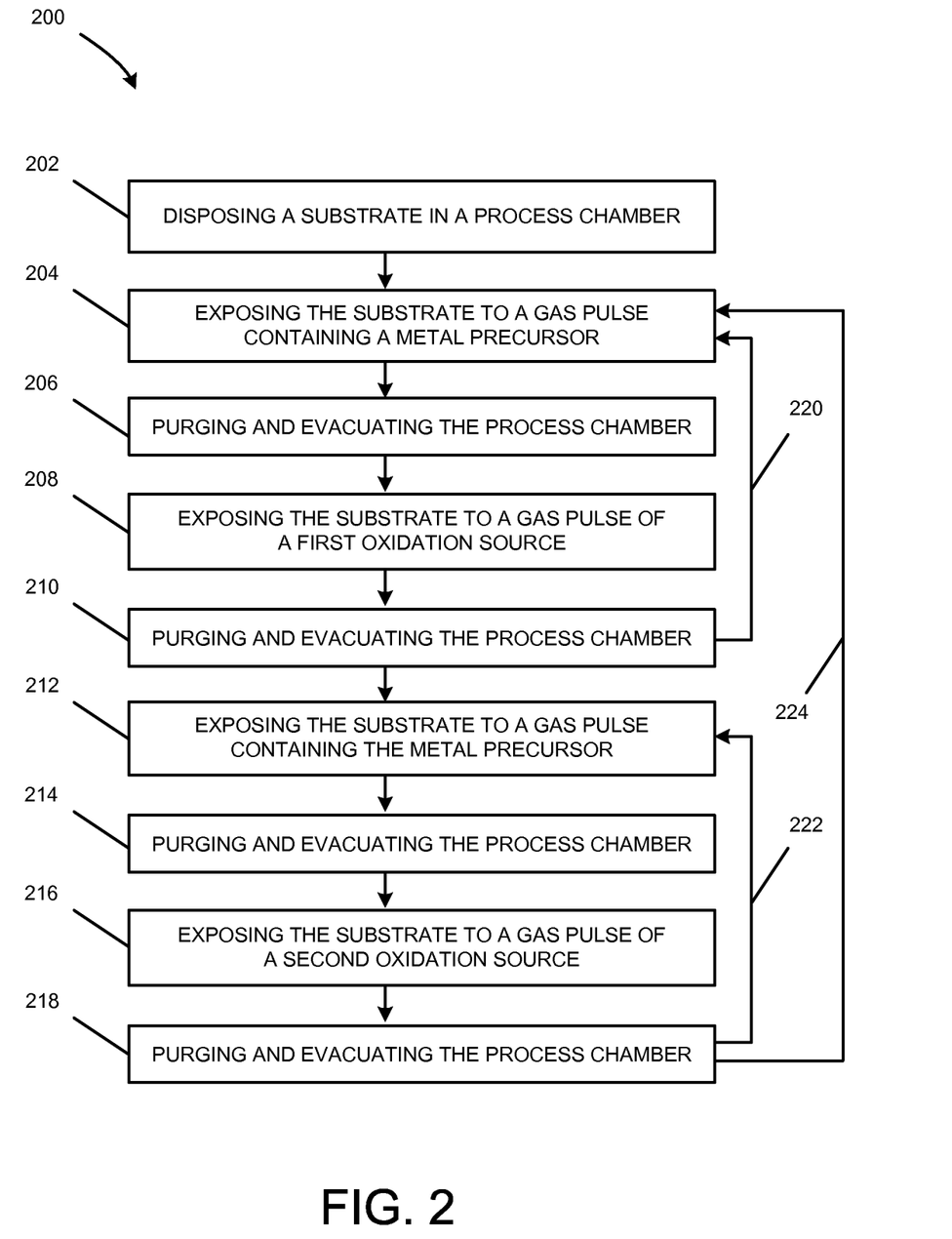
FIG. 2 is a process flow diagram for forming a high-k film according to an embodiment of the invention.
Figure 3:
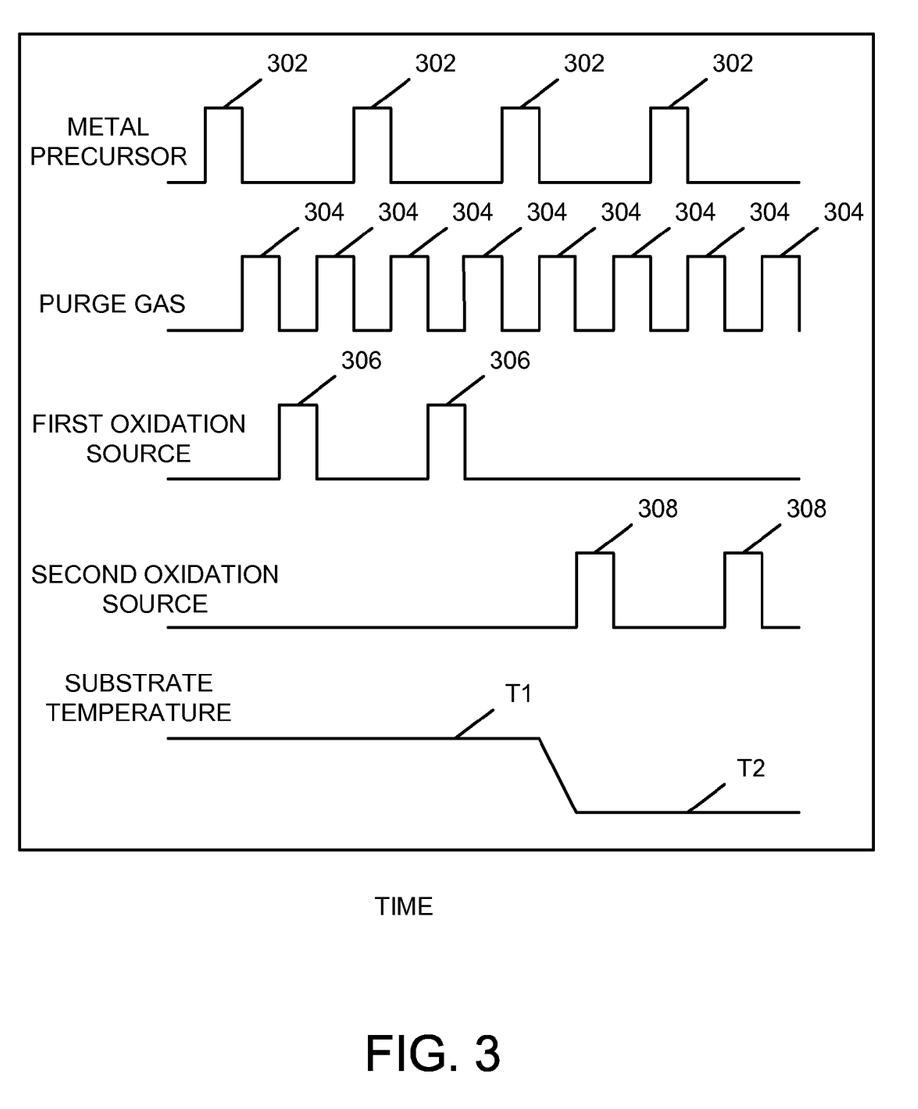
FIG. 3 is a gas flow diagram for forming a high-k film according to an embodiment of the invention.

Referring now to FIGS. 2 and 3, FIG. 2 is a process flow diagram for forming a high-k film according to an embodiment of the invention and FIG. 3 is a gas flow diagram for forming a high-k film according to an embodiment of the invention. The ALD process flow of FIG. 2 may be performed by the processing system 1 of FIG. 1, or any other suitable processing system configured to perform an ALD process. In FIG. 2, the process 200 begins when a substrate, such as a semiconductor substrate, is disposed in a process chamber of a processing system in block 202.

In block 204, the substrate is exposed to a gas pulse 302 containing a metal precursor, and in block 206, the process chamber is purged by a purge gas pulse 304 and evacuated to remove unreacted metal precursor and any byproducts from the process chamber. The metal precursor reacts with the surface of the heated substrate to form a chemisorbed layer containing the metal element. The substrate coverage of the chemisorbed layer is typically less than one complete monolayer, often less than about 0.5 monolayer, due to steric hindrances and possible limited number of reactive surface sites.

In block 208, the substrate is exposed to a gas pulse 306 of a first oxidation source containing $H_2O$, $H_2O_2$, or a combination thereof, and in block 210, the process chamber is purged by a purge gas pulse 304 and evacuated to remove unreacted first oxidation source and any byproducts from the process chamber 10. According to one embodiment of the invention, the gas pulse 306 may comprise $H_2O$ and an inert gas. By repeating the exposures in blocks 204-210 a predetermined number of times, as shown by the process flow 220, it is possible to deposit a first high-k film with a desired thickness on the substrate 25 while achieving layer by layer growth of about 1 angstrom per cycle. In FIG. 3, one cycle refers to performing the exposures in blocks 204-210 once. In the example depicted in FIG. 3, the exposures in blocks 204-210 are performed twice, but in other examples, the exposures in blocks 204-210 may be performed any number of times to deposit a desired film thickness. For example, a thickness of the first high-k film can be between about 5 angstrom and about 200 angstrom, or between about 5 angstrom and about 15 angstrom.

In block 212, the substrate is exposed to a gas pulse containing the metal precursor, and in block 214, the process chamber is purged by a purge gas pulse 304 and evacuated to remove unreacted metal precursor and any byproducts from the process chamber. In block 216, the substrate is exposed to a gas pulse 308 of a second oxidation source containing oxygen radicals (O), $O_3$, $O_2$, or a combination thereof, and in block 218, the process chamber is purged by a purge gas pulse 304 and evacuated to remove unreacted second oxidation source and any byproducts from the process chamber 10. By repeating the exposures in blocks 212-218 a predetermined number of times, as shown by the process flow 222, it is possible to deposit a second high-k film with a desired thickness on the first high-k film while achieving layer by layer growth of about 1 angstrom per cycle. In the example depicted in FIG. 3, the exposures in blocks 212-218 are performed twice, but in other examples, the exposures in blocks 212-218 may be performed any number of times to deposit a desired film thickness. The desired film thickness can depend on the type of semiconductor device or device region being formed. For example, a thickness of the second high-k film can be between about 5 angstrom and about 200 angstrom, or between about 5 angstrom and about 15 angstrom.

According to another embodiment of the invention, the exposure in block 208 can include a gas pulse 308 of the second oxidation source containing oxygen radicals (O), $O_3$, $O_2$, or a combination thereof, and the exposure in block 216 can include a gas pulse 306 of the first oxidation source containing $H_2O$, $H_2O_2$, or a combination thereof.

According to another embodiment of the invention, the metal precursors in blocks 204 and 212 may be different. In one embodiment, the metal precursors can have different chemical formulas but contain the same metal element. According to yet another embodiment, the metal precursors can contain different metal elements to deposit a high-k film containing a plurality (i.e., at least two) of metal elements. The relative concentration of each metal precursor in each gas pulse may be independently controlled to tailor the composition of the resulting high-k film. The process flows 220 and 222 may be repeated any number of times, as shown by the process flow 224, to form a plurality of alternating first and second high-k films until a high-k film with the desired number of alternating first and second high-k films has been formed.

FIG. 3 further illustrates variations in substrate temperature as a function of processing time according to one embodiment of the invention. The substrate is maintained at a temperature T1 during deposition of the first high-k film on the substrate 25 and the substrate 25 is maintained at a temperature T2 that is lower than temperature T1 during deposition of the second high-k film onto the first high-k film. According to other embodiments, the temperature T1 may be equal to the temperature T2, or the temperature T1 may be less than the temperature T2.

According to another embodiment of the invention, one or more additional gas pulse sequences may be added to the process 200 of FIG. 2 for incorporating silicon into the high-k film. For example, the one or more additional gas pulse sequences may include, first, exposing a gas pulse containing a silicon precursor to the substrate, and second, exposing a gas pulse containing the first oxidation source, the second oxidation source, or a combination thereof, to the substrate. Embodiments of the invention may utilize a wide variety of silicon precursors for incorporating silicon into the high-k films. Examples of silicon precursors include $SiH_4$, $Si_2H_6$, $SiCl_3H$, $SiC_{12}H_2$, $SiClH_3$, $Si_2Cl_6$, $((CH_3)_2N)_3SiH$ (tris(dimethylamino) silane, $((CH_3)_2N)_2SiH_2$ (bis(dimethylamino)silane, and $((CH_3)_2N)_4Si)$ (tetrakis(dimethylamino)silane).

Figure 4:
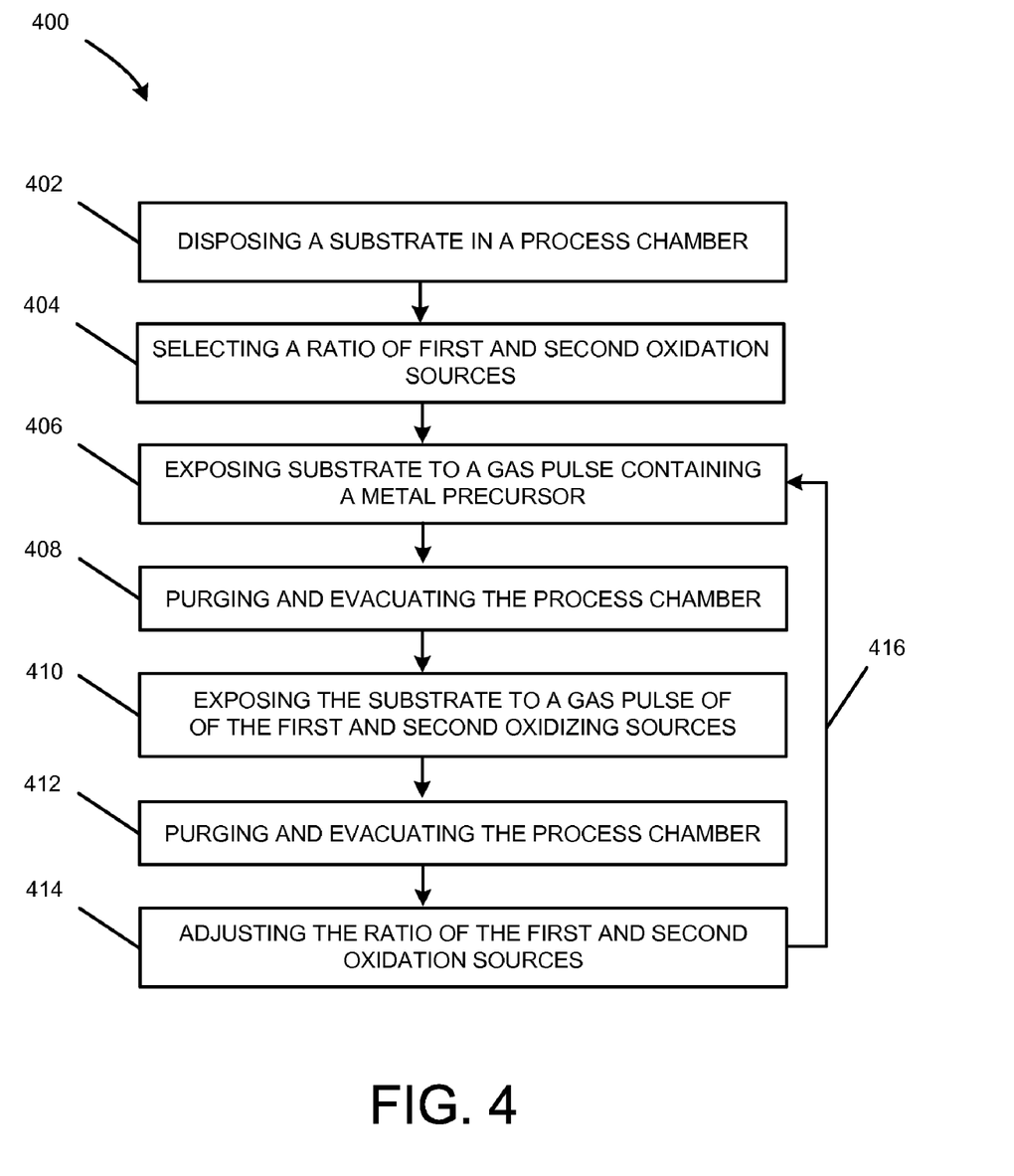
FIG. 4 is a process flow diagram for forming a high-k film according to another embodiment of the invention.
Figure 5:
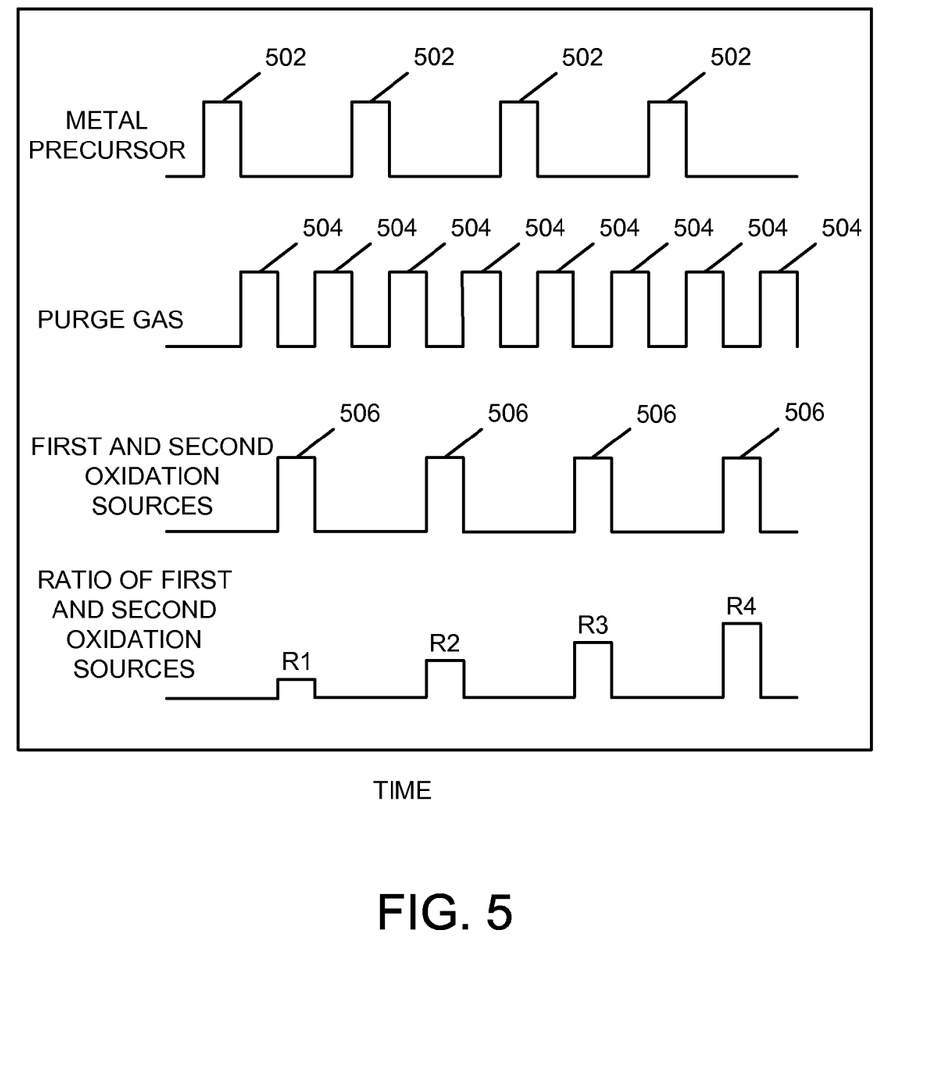
FIG. 5 is a gas flow diagram for forming a high-k film according to another embodiment of the invention.

Referring now to FIGS. 4 and 5, FIG. 4 is a process flow diagram for forming a high-k film according to an embodiment of the invention and FIG. 5 is a gas flow diagram for forming a high-k film according to an embodiment of the invention. The ALD process flow of FIG. 4 may be performed by the processing system 1 of FIG. 1, or any other suitable processing system configured to perform an ALD process. In FIG. 4, the process 400 begins when a substrate, such as a semiconductor substrate, is disposed in a process chamber of a processing system in block 402.

In block 404, a ratio Rx (x=1, 2, 3, . . . ) of first and second oxidation sources is selected. The first oxidation source can contain $H_2O$, $H_2O_2$, or a combination thereof, and the second oxidation source can contain oxygen radicals (O), $O_3$, $O_2$, or a combination of two or more thereof. The ratio Rx may, for example, be defined as $Ox_1/Ox_2$ or $Ox_1/(Ox_1+Ox_2)$, where $Ox_1$ and $Ox_2$ refer to the amounts (e.g., gas flow rate) of the first and second oxidation sources, respectively. According to one embodiment, the ratio Rx may be varied from a first ratio corresponding to substantially pure first oxidation source, to an intermediate ratio corresponding to a combination of the first and second oxidation sources, to a final ratio corresponding to substantially pure second oxidation source. In one example, an $Ox_1/(Ox_1+Ox_2)$ ratio may increase monotonically as 0, 0.05, 0.10, . . . , 0.90, 0.95, and 1.0, during deposition of the high-k film. In another example, an $Ox_1/(Ox_1+Ox_2)$ ratio may decrease monotonically as 1.0, 0.95, 0.90, . . . , 0.1, 0.05, and O, during deposition of the high-k film. In other examples, an $Ox_1/(Ox_1+Ox_2)$ ratio may vary non-monotonically during deposition of the high-k film.

In block 406, the substrate is exposed to a gas pulse 502 containing a metal precursor, and in block 408, the process chamber 10 is purged by a purge gas pulse 504 and evacuated to remove unreacted metal precursor and any byproducts from the process chamber.

In block 410, the substrate is exposed to a gas pulse 506 containing the first and second oxidation sources in a selected ratio R1, and in block 412, the process chamber is purged by a purge gas pulse 504 and evacuated to remove unreacted first and second oxidation sources and any byproducts from the process chamber.

In block 414, the ratio R1 of the first and second oxidation sources is adjusted to a new ratio R2. In the example depicted in FIG. 5, R2 is greater than R1. However, in other examples R2 may be less than or equal to R1.

The exposures in blocks 406-414 may be repeated a predetermined number of times, as shown by the process flow 416, to deposit a high-k film with a desired thickness on the on the substrate. For example, a thickness of the high-k film can be between about 10 angstrom and about 400 angstrom, or between about 10 angstrom and about 30 angstrom. According to an embodiment of the invention, the exposure in block 406 may contain a plurality (i.e., at least two) of different metal precursors containing different metal elements. The relative concentration of each metal precursor in each gas pulse may be independently controlled to tailor the composition of the resulting high-k film. In the example depicted in FIG. 5, the exposures in blocks 406-414 are performed four times using ratios R1-R4, but in other examples, the exposures in blocks 406-414 may be performed any number of times to deposit a desired film thickness.

Still referring to FIGS. 4 and 5, although not shown, the substrate temperature may be varied as a function of processing time. In one example, the temperature of the substrate may be ramped from a temperature T1 to a temperature T2 during deposition of a high-k film, where the T2 is higher or lower than the T1. This is not required for embodiments of the invention, as the substrate may be maintained at substantially the same temperature during deposition of a high-k film.

According to another embodiment of the invention, one or more of gas pulse sequences may be added to the process 400 for incorporating silicon into the high-k film. For example, the one or more gas pulse sequences may include, first, exposing a gas pulse containing a silicon precursor to the substrate, and second, exposing a gas pulse containing the first oxidation source, the second oxidation source, or a combination thereof, to the substrate. Exemplary silicon precursors are described above in reference to FIGS. 2 and 3.

Figure 6:
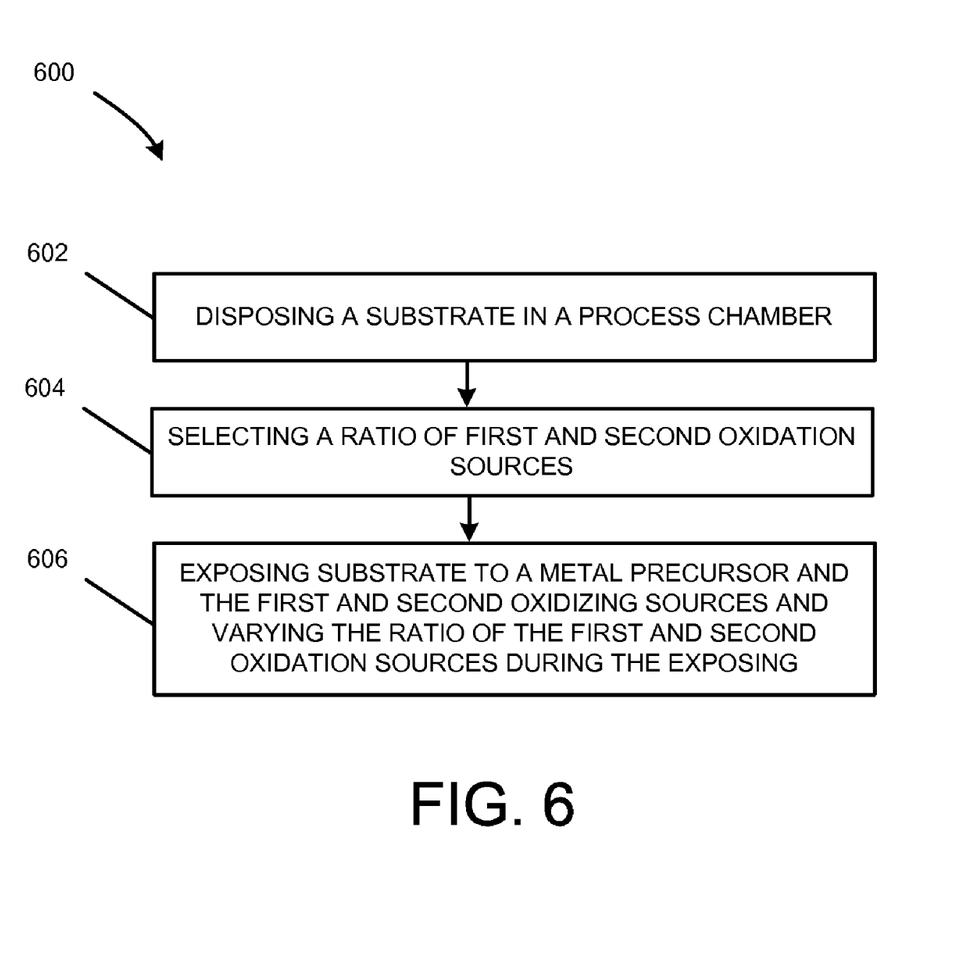
FIG. 6 is a process flow diagram for forming a high-k film according to yet another embodiment of the invention.
Figure 7:
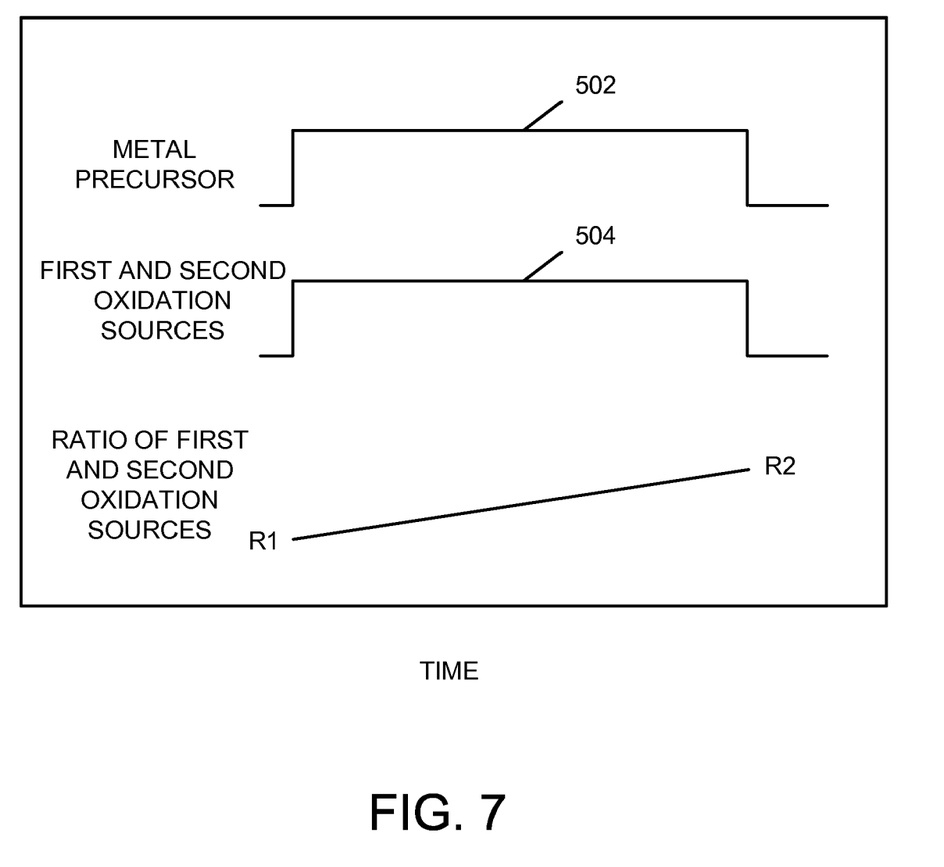
FIG. 7 is a gas flow diagram for forming a high-k film according to yet another embodiment of the invention.

Referring now to FIGS. 6 and 7, FIG. 6 is a process flow diagram for forming a high-k film according to an embodiment of the invention and FIG. 7 is a gas flow diagram for forming a high-k film according to an embodiment of the invention. The CVD process flow of FIG. 6 may be performed by the processing system 1 of FIG. 1, or any other suitable processing system configured to perform a CVD process. In FIG. 6, the process 600 begins when a substrate, such as a semiconductor substrate, is disposed in a process chamber of a processing system in block 602.

In block 604, a ratio Rx (x=1, 2, 3, . . . ) of first and second oxidation sources is selected. The first oxidation source can contain $H_2O$, $H_2O_2$, or a combination thereof, and the second oxidation source can contain oxygen radicals (O), $O_3$, $O_2$, or a combination of two or more thereof. The ratio Rx may, for example, be defined as $Ox_1/Ox_2$ or $Ox_1/(Ox_1+Ox_2)$, where $Ox_1$ and $Ox_2$ refer to the amounts (e.g., gas flow rate) of the first and second oxidation sources, respectively. According to one embodiment, the ratio Rx may be varied from a first ratio corresponding to substantially pure first oxidation source, to an intermediate ratio corresponding to a combination of the first and second oxidation sources, to a final ratio corresponding to substantially pure second oxidation source. In one example, an $Ox_1/(Ox_1+Ox_2)$ ratio may increase monotonically as 0, 0.05, 0.10, . . . , 0.90, 0.95, and 1.0, during deposition of the high-k film. In another example, an $Ox_1/(Ox_1+Ox_2)$ ratio may decrease monotonically as 1.0, 0.95, 0.90, . . . , 01, 0.05, and O, during deposition of the high-k film. In other examples, an $Ox_1/(Ox_1+Ox_2)$ ratio may vary non-monotonically during deposition of the high-k film.

In block 606, the substrate is exposed to a metal precursor and the first and second oxidation sources in a selected ratio R1 and, subsequently, the ratio R1 is adjusted to a different ratio R2 during the exposing. In the example in FIG. 7, R2 is greater than R1; however, R2 may be less than R1. The exposure in block 606 can be performed for a predetermined length of time to deposit a high-k film with a desired thickness on the substrate. For example, a thickness of the high-k film can be between about 10 angstrom and about 400 angstrom, or between about 10 angstrom and about 30 angstrom.

Still referring to FIGS. 6 and 7, although not shown, the substrate temperature may be varied as a function of processing time. In one example, the temperature of the substrate may be ramped from a temperature T1 to a temperature T2 during deposition of a high-k film, where the T2 is higher or lower than the T1. This is not required for embodiments of the invention, as the substrate may be maintained at substantially the same temperature during deposition of a high-k film.

According to another embodiment of the invention, additional gas exposures may be added to the process 600 for incorporating silicon into the high-k film. For example, the additional gas exposures may include exposing a silicon precursor to the substrate. Exemplary silicon precursors are described above in reference to FIGS. 2 and 3.

A plurality of embodiments for depositing high-k films using a plurality of oxidation sources in ALD and CVD processing has been described. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the workpiece; there may be a second film or other structure between the film and the substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a high-k film, comprising:
disposing a substrate in a process chamber; and
exposing the substrate to a gas pulse sequence to deposit a high-k film with a predetermined thickness, wherein the gas pulse sequence includes, in any order:
a) sequentially first, exposing the substrate to a gas pulse comprising a first metal precursor, and second, exposing the substrate to a gas pulse of a first oxidation source comprising $H_2O$, $H_2O_2$, or a combination thereof, and
b) sequentially first, exposing the substrate at to a gas pulse comprising a second metal precursor, and second, exposing the substrate to a gas pulse of a second oxidation source comprising oxygen radicals (O), $O_3$, $O_2$, or a combination of two or more thereof, but not containing $H_2O$ or $H_2O_2$,
wherein each of a) and b) are repeated any number of times, and wherein the gas pulse sequence including a) and b) is repeated, in any order, any number of times to achieve the predetermined thickness.

2. The method of claim 1, wherein the first and second metal precursors comprise the same one or more metal elements selected from alkaline earth elements, rare earth elements, and Group IVB elements of the Periodic Table of the Elements.

3. The method of claim 1, wherein the first and second metal precursors comprise one or more different metal elements selected from alkaline earth elements, rare earth elements, and Group IVB elements of the Periodic Table of Elements.

4. The method of claim 1, further comprising:
performing additional exposure steps, wherein each additional exposure step comprises sequentially first, exposing the substrate to a gas pulse comprising a silicon precursor, and second, exposing the substrate to a gas pulse comprising $H_2O$, $H_2O_2$, oxygen radicals (O), $O_3$, or $O_2$, or a combination of two or more thereof.

5. The method of claim 1, wherein the gas pulse sequence includes performing a) before b), and wherein a) comprises:
sequentially first, exposing the substrate to a gas pulse comprising a first metal precursor, and second, exposing the substrate to a gas pulse comprising $H_2O$ and an inert gas.

6. The method of claim 5, wherein the second oxidation source comprises $O_3$.

7. A method for forming a high-k film, comprising:
disposing a substrate in a process chamber; and
exposing the substrate to a gas pulse sequence to deposit a high-k film with a predetermined thickness, wherein the gas pulse sequence includes:
sequentially first, exposing the substrate to a gas pulse comprising a metal precursor, and second, exposing the substrate to a gas pulse comprising a first oxidation source and a second oxidation source, wherein the first oxidation source comprises $H_2O$, $H_2O_2$, or a combination thereof, and the second oxidation source comprises oxygen radicals (O), $O_3$, or $O_2$, or a combination of two or more thereof,
wherein the gas pulse sequence is repeated any number of times to achieve the predetermined thickness, and wherein a ratio of the first and second oxidation sources in the gas pulse comprising the first and second oxidation sources is varied during the deposition of the high-k film.

8. The method of claim 7, wherein the ratio is varied from a first ratio corresponding to a gas pulse containing substantially pure first oxidation source to a second ratio corresponding to substantially pure second oxidation source, or the ratio is varied from a first ratio corresponding to a gas pulse containing substantially pure second oxidation source to a second ratio corresponding to a gas pulse containing substantially pure first oxidation source.

9. The method of claim 7, wherein the metal precursor comprises one or more metal elements selected from alkaline earth elements, rare earth elements, and Group IVB elements of the Periodic Table of the Elements.

10. The method of claim 7, further comprising:
varying the temperature of the substrate during the deposition of the high-k film.

11. The method of claim 10, wherein the varying comprises:
ramping the temperature of the substrate from a first temperature to a second temperature during the deposition of the high-k film, wherein the second temperature is higher or lower than the first temperature.

12. The method of claim 7, wherein the gas pulse sequence further comprises
sequentially first, exposing the substrate to a gas pulse comprising a silicon precursor, and second, exposing the substrate to a gas pulse comprising the first oxidation source, the second oxidation source, or a combination thereof.

13. A method for forming a high-k film, comprising:
disposing a substrate in a process chamber; and
simultaneously exposing the substrate to a metal precursor, a first oxidation source, and a second oxidation source, wherein the first oxidation source comprises $H_2O$, $H_2O_2$, or a combination thereof, and the second oxidation source comprises oxygen radicals (O), $O_3$, or $O_2$, or a combination of two or more thereof, wherein a ratio of the first and second oxidation sources is varied during at least a portion of the exposing.

14. The method of claim 13, wherein the ratio is varied from a first ratio corresponding to a gas pulse containing substantially pure first oxidation source to a second ratio corresponding to substantially pure second oxidation source, or the ratio is varied from a first ratio corresponding to a gas pulse containing substantially pure second oxidation source to a second ratio corresponding to a gas pulse containing substantially pure first oxidation source.

15. The method of claim 13, wherein the metal precursor comprises one or more metal elements selected from alkaline earth elements, rare earth elements, and Group IVB elements of the Periodic Table of the Elements.

16. The method of claim 13, wherein the varying comprises:
ramping the temperature of the substrate from a first temperature to a second temperature during the deposition of the high-k film, wherein the second temperature is higher or lower than the first temperature.

17. The method of claim 13, further comprising
exposing the substrate to a gas pulse comprising a silicon precursor, and second, exposing the substrate to a gas pulse comprising the first oxidation source, the second oxidation source, or a combination thereof.

* * * * *